(12) United States Patent
Van De Kerkhof

(10) Patent No.: US 7,889,315 B2
(45) Date of Patent: Feb. 15, 2011

(54) LITHOGRAPHIC APPARATUS, LENS INTERFEROMETER AND DEVICE MANUFACTURING METHOD

(75) Inventor: Marcus Adrianus Van De Kerkhof, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 1290 days.

(21) Appl. No.: 11/403,193

(22) Filed: Apr. 13, 2006

(65) Prior Publication Data

US 2007/0242256 A1    Oct. 18, 2007

(51) Int. Cl.
G03B 27/42    (2006.01)
(52) U.S. Cl. .................... 355/53; 355/71; 355/77
(58) Field of Classification Search .............. 355/53, 355/71, 77, 67; 356/521, 450, 491–495
See application file for complete search history.

(56) References Cited

U.S. PATENT DOCUMENTS 6,813,000 B1* 11/2004 Nishi ........................... 355/53
2001/0055103 A1* 12/2001 Nishi ........................... 355/53
2002/0001088 A1*  1/2002 Wegmann et al. ............ 356/521
2004/0080754 A1*  4/2004 Tobiason et al. ............. 356/495
2006/0119838 A1*  6/2006 Emer et al. .................. 356/124

FOREIGN PATENT DOCUMENTS

| CN | 100490064 C | 3/2010 |
| EP | 1 231 517 A1 | 8/2002 |
| EP | 1670043 A2 | 6/2006 |
| WO | 01/63233 A2 | 8/2001 |

\* cited by examiner

Primary Examiner—Edward J Glick
Assistant Examiner—Mesfin T Asfaw
(74) Attorney, Agent, or Firm—Pillsbury Winthrop Shaw Pittman LLP

(57) ABSTRACT

A lithographic apparatus includes an illumination system that is configured to condition a radiation beam; a projection system that is configured to project at least a portion of the radiation beam as a projected radiation beam; and a lens interferometer for sensing a wavefront state of the projected radiation beam. The lens interferometer is provided with a polarizing element so as to be capable of sensing a polarisation state of the projected radiation beam.

30 Claims, 5 Drawing Sheets

LITHOGRAPHIC APPARATUS, LENS INTERFEROMETER AND DEVICE MANUFACTURING METHOD

FIELD

The present invention relates to a lithographic apparatus, a lens interferometer for a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate. Increasingly, lithographic projection tools are becoming capable of imaging a pattern on a layer at relatively high numerical aperture NA (NA>1).

Due to the nature of the imaging process, a control of the polarisation of the illumination beam becomes therefore more important. As known to persons skilled in the art, a lithographic imaging process involves an exposure of a mask pattern on a radiation-sensitive layer on a substrate. Typically, at the mask diffraction patterns are formed by interaction of the illumination beam impinging on the mask with the mask pattern. The diffraction patterns each pass through a projection system and are then imaged as the interference pattern of the diffraction patterns on the substrate layer. At higher numerical aperture, the interference of the diffraction patterns is affected by the polarisation of light in each of the light beams that build up the respective diffraction patterns. Maximal interference is achieved when the polarisation vectors of the individual interfering beams are fully parallel. If the orientation of the polarisation vectors of the beams is not parallel interference will be less, which results in a reduced contrast of the image to be formed. It is also known that polarisation state of the diffracted beams may be affected by the mask pattern, in particular as a function of the pitch of the mask pattern, and by the projection system.

SUMMARY

It is desirable to have a lithographic apparatus which is capable of obtaining information on a polarisation state of a light beam impinging on the substrate table. According to an aspect of the invention, there is provided a lithographic apparatus comprising an illumination system configured to condition a radiation beam; a projection system configured to project at least a portion of the radiation beam as a projected radiation beam; and a lens interferometer for sensing a wavefront state of the projected radiation beam, wherein the lens interferometer is provided with a polarizing element so as to be capable of sensing a polarisation state of the projected radiation beam.

Also, it is desirable to have a sensor for a lithographic apparatus which is capable of detecting the polarisation state of a light beam impinging on the substrate table. According to an aspect of the invention, there is provided a lens interferometer for a lithographic apparatus, the lithographic apparatus comprising an illumination system configured to condition a radiation beam and a projection system configured to project at least a portion of the radiation beam as a projected radiation beam; the lens interferometer being arranged for sensing a wavefront state of a radiation beam, wherein the lens interferometer is provided with a polarizing element so as to be capable of sensing a polarisation state of the radiation beam. Moreover, it is desirable to have a method for manufacturing a device, which allows obtaining information on the polarisation state of a light beam impinging on the substrate table. According to an aspect of the invention, there is provided a device manufacturing method comprising projecting at least a portion of a radiation beam as a projected radiation beam, providing a lens interferometer for sensing a wavefront state of the projected radiation beam, and providing the lens interferometer with a polarizing element so as to be capable of sensing a polarisation state of the projected radiation beam.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
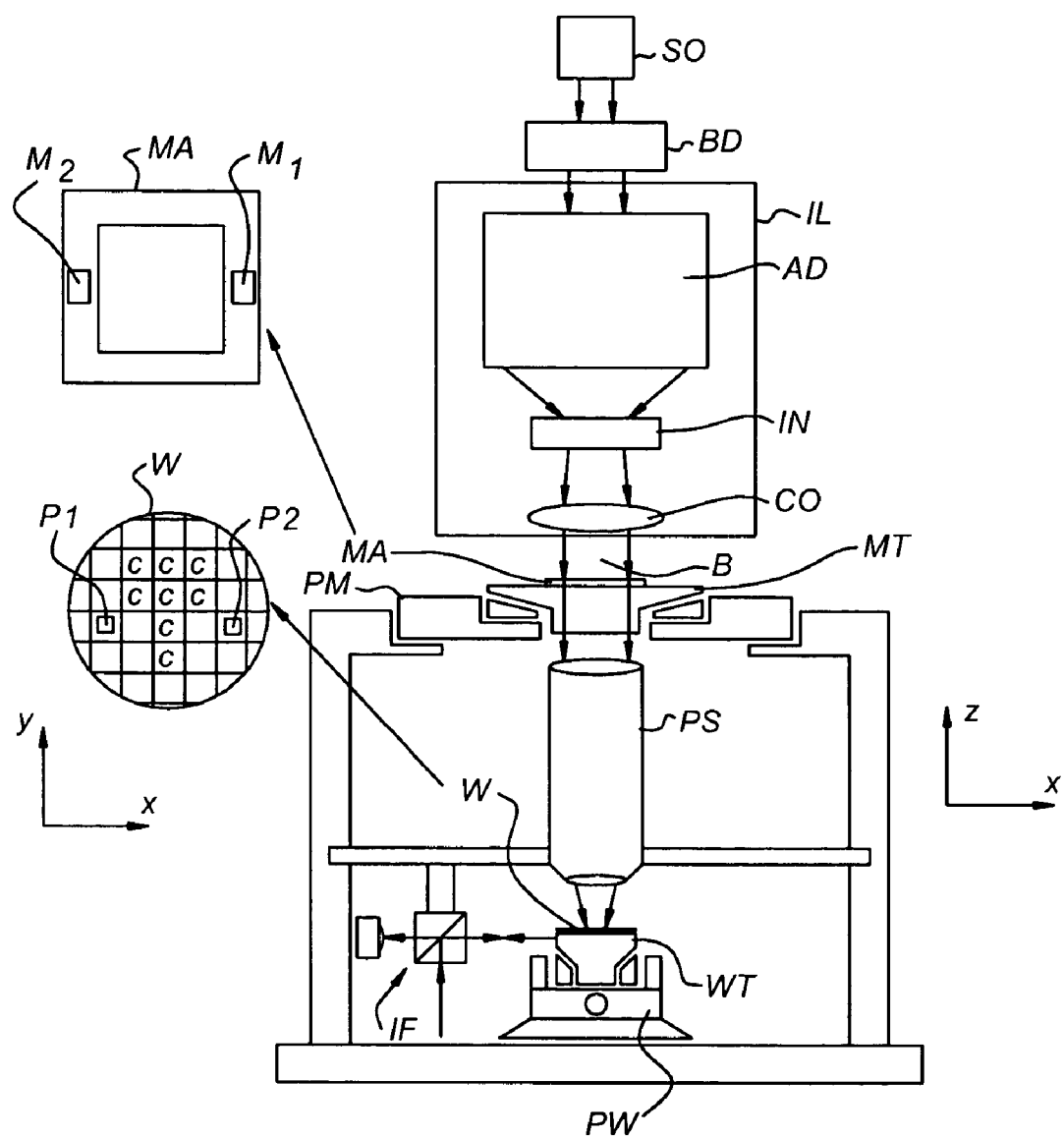
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation. The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit. The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system". As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when -the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system. The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above. Combinations and/or variations on the above described modes of use or entirely different modes of use may also be employed.

Figure 2:
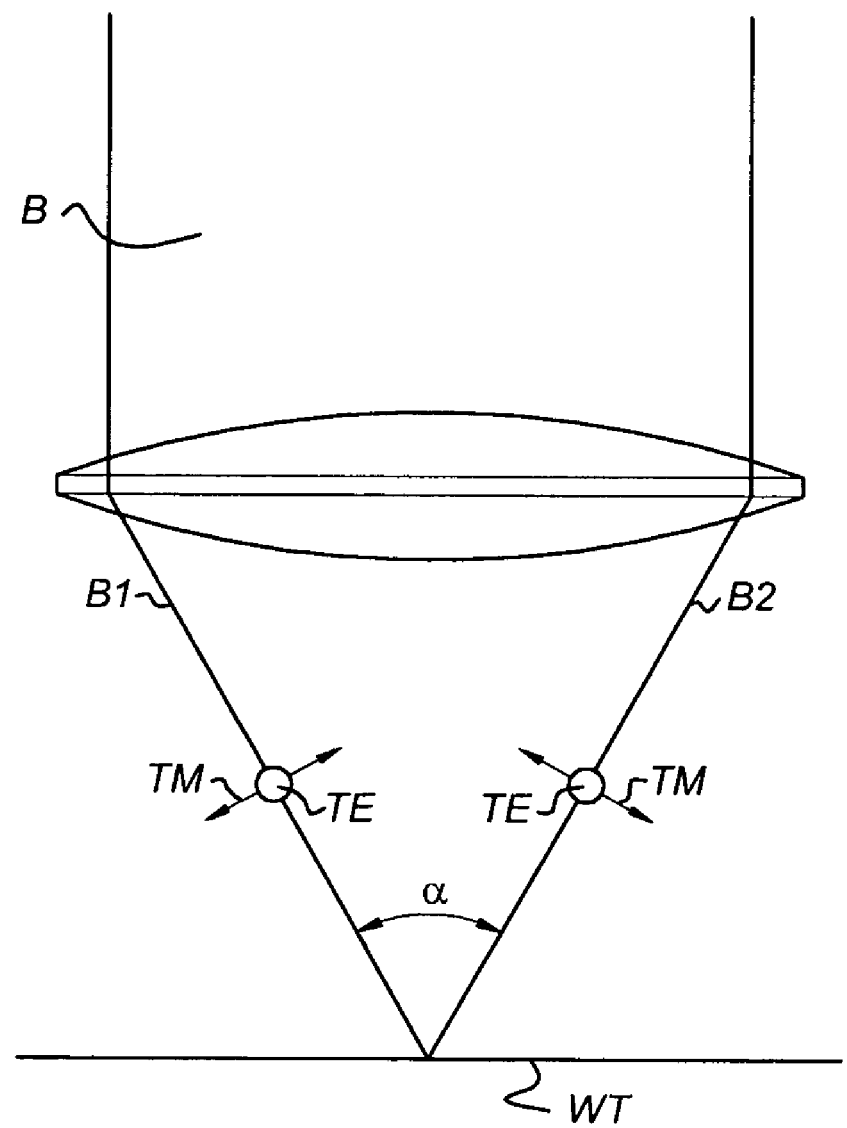
FIG. 2 depicts a detailed view of the lithographic apparatus of FIG. 1.

FIG. 2 depicts a detailed view of a portion of the lithographic apparatus of FIG. 1. In FIG. 2 entities with the same reference number refer to identical entities as shown in the preceding figures.

In this detailed view the optical path of the radiation beam B after passing the projection lens system PL is schematically depicted. After passing the projection lens system PL, the radiation beam B is focused for imaging on the substrate (layer). The angle α, which is enclosed between the boundaries of the convergent beam B, is directly linked to the pitch of the structures being imaged; smaller pitches correspond to larger angles α and the limit here is determined by the NA of the projection system.

In FIG. 2, polarisation modes of light in the first and second sub-beams B1 and B2 of the radiation beam B that depart the projection system PL at the right boundary and the left boundary, respectively, are schematically indicated. The transverse-magnetic or TM polarisation mode is within the plane of drawing, perpendicular to the propagation direction of the light. The transverse-electric or TE polarisation mode is perpendicular to the plane of drawing and perpendicular to the propagation direction of the light. As briefly discussed above, at relatively large angle α, the orientation of the TM polarisation of light in the first sub-beam B1 differs from the orientation of the TM polarisation in the second sub-beam B2. Interference of the sub-beams B1, B2 at the image plane WT will therefore not be maximal. Conversely, the TE polarisation modes of the first and second sub-beams B1, B2 are parallel for every angle α and their interference will be maximal, which results in a maximal contrast.

A skilled person will appreciate that for optimal interference and contrast the use of (primarily) TE polarised radiation is preferred and that therefore the illumination mode, i.e., the intensity distribution and the polarisation distribution of the radiation beam in the pupil-plane, may be conditioned by the illuminator IL in such a way that a mask pattern can be imaged at relatively high aperture with a relatively high contrast. In that case, it is desired that the illumination mode has a suitable TE polarisation distribution for a given mask pattern.

For a given mask pattern, an optimal intensity and polarisation distribution in the pupil plane can be designed. In the lithographic apparatus the illuminator IL is capable of producing the intensity and polarisation distribution in the pupil plane in accordance with the design.

It is noted that the illumination mode, in particular the polarisation distribution, as produced by the illuminator IL is affected by the interaction of the light with the mask pattern. Also, the interaction with the projection system PL affects the polarisation distribution due to the interplay of reflection and transmission of the light at the surface of each lens in the projection system.

The interaction with the mask pattern may be analyzed ex-situ (i.e. external of the lithographic apparatus); the interaction with the projection system PL may only be determined by an in-situ characterization of the illumination mode in the pupil-plane.

Figure 3:
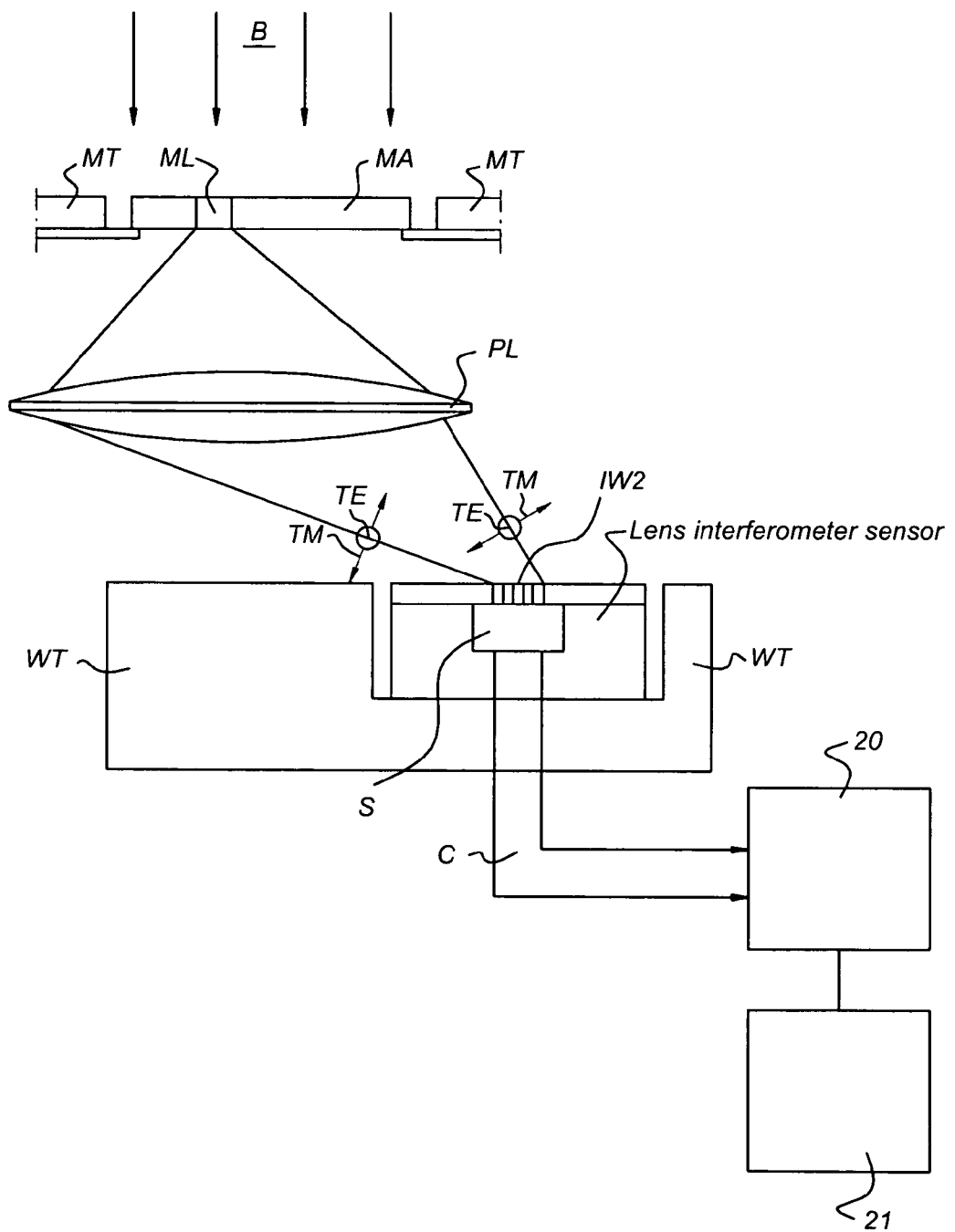
FIG. 3 schematically depicts a measurement system according to an embodiment of the invention.

FIG. 3 schematically depicts a measurement system according to an embodiment of the invention. In FIG. 3, entities with a same reference number refer to identical entities as shown in the preceding figures.

The measurement system depicted in FIG. 3 is often referred to as a lens interferometer. It is noted that lens interferometers per se are known in the art. WO 01/63233A2 and EP 1231517 A1 disclose a lens interferometer for a lithographic apparatus. Such a lens interferometer is basically used to measure lens aberrations. A common embodiment of such a lens interferometer is based on the principle of shearing interferometry. "Optical Shop Testing" (2nd edition), ISBN 0-471-52232-5, by Daniel Malacara gives an overview of available lens interferometers. In general, one could state that a lens interferometer measures lens aberrations at a single field point in the pupil plane by measuring both phase and transmission of the radiation beam without consideration of the actual polarisation state.

According to the present invention, the lens interferometer is provided with a polarizing element so as to be capable of sensing the polarisation state of the radiation beam in the pupil plane.

In the measurement system of FIG. 3, next to the reticle MA the reticle stage MT is shown, provided with a lens interferometer aperture ML at the reticle level. According to this embodiment, the lens interferometer aperture ML is positioned on the reticle MA. It will however be understood that this lens interferometer aperture ML may also be positioned on the reticle table MT.

The measurement system according to the embodiment further comprises a lens interferometer marker IW2 on substrate table WT.

A two-dimensional detector or detector array S is positioned behind the lens interferometer marker IW2 (seen with respect to the propagation direction of the alignment beam AB). The lens interferometer marker IW2 is located substantially on the image plane level (i.e., the same level as a substrate W).

The lens interferometer aperture ML is arranged for selecting a portion of the radiation beam B for propagation through the projection lens system PL.

The detector S is arranged for detecting light from the selected portion of the radiation that travels through the projection system, impinges on the lens interferometer marker IW2, and diffracts there. The resulting diffraction pattern is then imaged on a detection plane of the detector S.

The position of the detector S is coupled to the position of the lens interferometer aperture ML in such a way that the detector S is at the position of the projected image of the lens interferometer aperture ML at the level of the detector S.

The detector S may be a camera or an imaging device such as a charge coupled device (CCD) detector or a CMOS image detector. Basically, such a detector S measures the intensity of impinging radiation. The detector S is connected to an image analyzer device 20, which is arranged for analyzing an image captured by the detector S.

Due to volume constraints in the substrate table WT, a straightforward implementation of a polarizing element with sufficient extinction ratio between the lens interferometer marker IW2 and the detector S is often not possible in practice.

Also, due to the use of UV radiation as radiation beam B, the choice of birefringent materials that transmit this type of radiation is limited. Materials that allow transmission of UV radiation typically exhibit optical properties that prevent the design of suitably small polarizer elements.

Figure 4A:
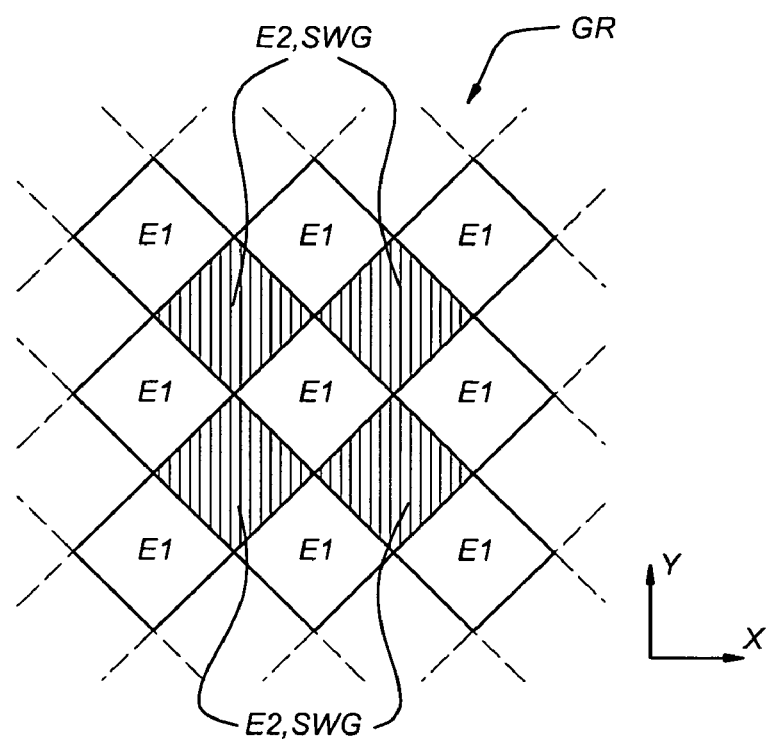
FIG. 4 schematically depicts a grating for a lens interferometer sensor in accordance with the present invention.
Figure 4B:
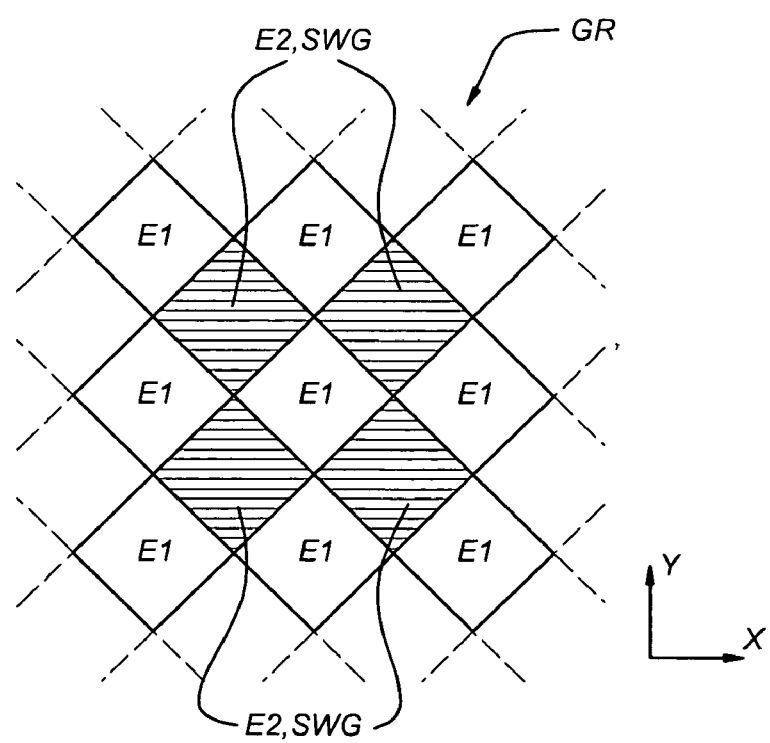

In the present invention, it is recognized that the polarisation state can be detected by incorporating the polarizing element into the lens interferometer marker IW2. FIGS. 4a, 4b schematically depicts an embodiment of the lens interferometer marker for use with a lens interferometer sensor in accordance with the present invention.

The lens interferometer marker IW2 comprises at least one transmissive grating structure or grating patch GR. The at least one transmissive grating structure GR comprises a plurality of surface elements of a first type E1 and a second type E2 which are arranged in an alternating periodic sequence and which have a mutually different transmission in order to diffract the impinging radiation beam and to generate a spatial coherence distribution for radiation wave fronts at the detection plane of the detector S. For example, the first type of surface elements E1 relates to surface elements comprising a metal layer (e.g., chromium), which is substantially opaque for radiation, and the second type E2 relates to other surface elements that are open regions substantially transparent for radiation.

In the embodiment shown in FIGS. 4a, 4b the at least one transmissive grating structure GR is a two-dimensional checkerboard structure which extends in the X-direction and the Y-direction, the Y-direction being perpendicular to the X-direction. The skilled person will however appreciate that the transmissive grating structure GR may have another two-dimensional structure.

The embodiments of the transmissive grating structure GR (as shown in FIG. 4a and FIG. 4b) have a transmissive grating pitch (i.e. the repetition length of open E2 and opaque E1 regions) in the X- and Y-direction, which is optimized for shearing interferometry. Typically, the transmissive grating pitch may be about 5-20 µm.

It is noted that typically, the X- and Y-directions coincide with the orthogonal translational directions X, Y of the wafer stage or substrate table WT.

In the present invention, the open elements E2 in the grating patch GR are provided with a sub-wavelength grating SWG, i.e., an alternating sequence of sub-wavelength lines and spaces, in which the lines and spaces have different transmission properties for impinging radiation, with a pitch smaller than twice the wavelength of the impinging radiation.

For example, the sub-wavelength gratings SWG may have a pitch in the range of about 30-about 200 nm, depending on the actual wavelength of the impinging radiation. The sub-wavelength gratings SWG may be manufactured by using a lithographic processing technology with relatively short wavelength, for example, two-beam immersion interferometry or electron beam lithography.

In FIG. 4a, the pitch (periodicity) of the sub-wavelength grating lines and spaces in the open elements is directed in substantially the X-direction. In FIG. 4b, the pitch of the sub-wavelength grating lines and spaces in the open elements is directed in substantially the Y-direction.

Each of the sub-wavelength gratings SWG shown in FIG. 4a, 4b will act as a polarisation filter. Note that a sub-wavelength grating SWG with a pitch directed in a given direction for example the X-direction will have a different transmission for radiation with a linear polarisation in the X-direction than for radiation with a linear polarisation in the Y-direction. It is noted that the transmissive grating structure GR may comprise a combination of one or more sub-wavelength gratings SWG with a pitch in the X-direction and one or more sub-wavelength gratings SWG with an identical pitch in the Y-direction.

As mentioned above, the detector S is capable of measuring the (two-dimensional) intensity (distribution) of an image projected on the detector without consideration of the polarisation state.

Figure 5:
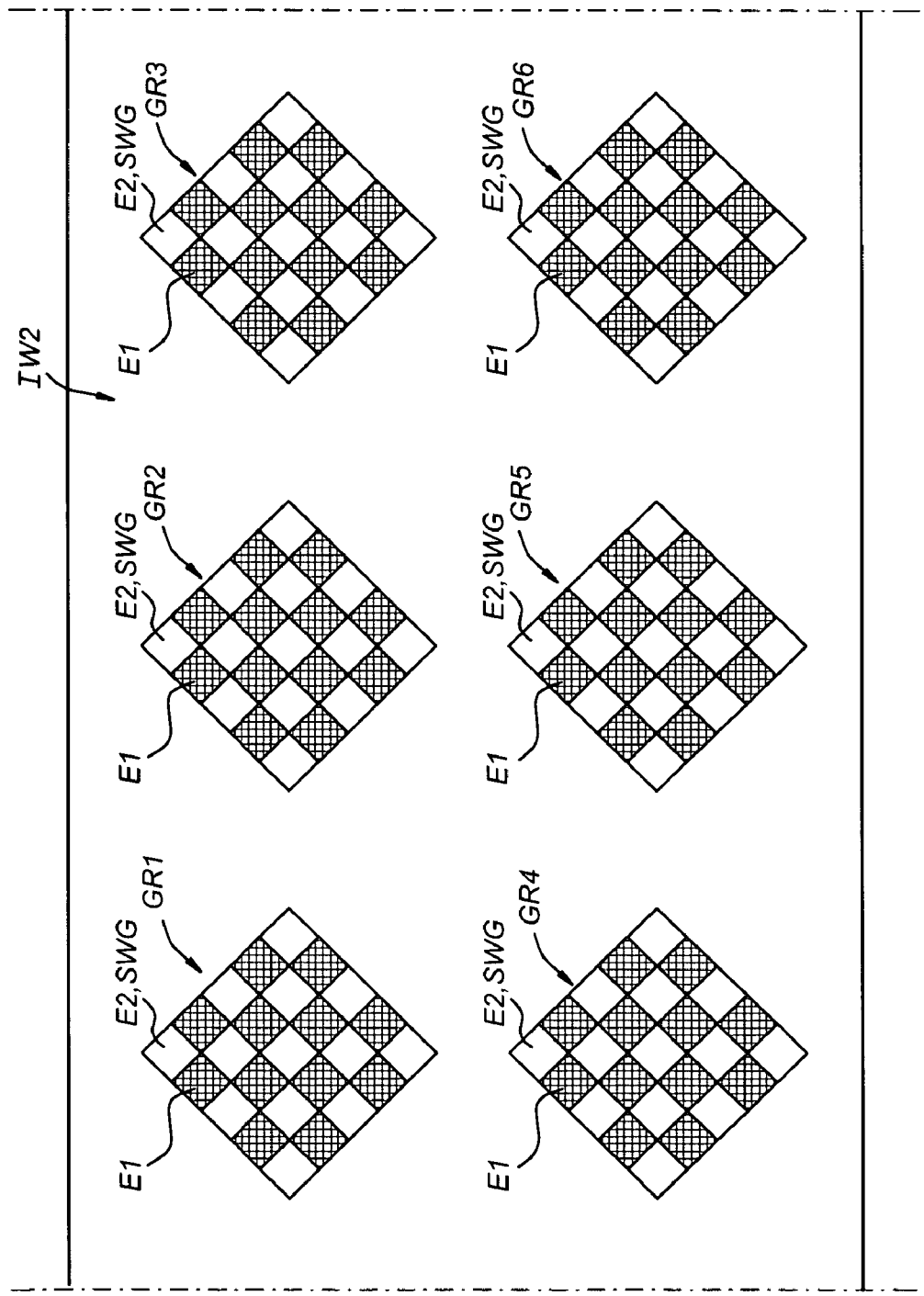
FIG. 5 schematically depicts a second embodiment of the lens interferometer marker for use with a lens interferometer sensor in accordance with the present invention.

FIG. 5 schematically depicts a second embodiment of the lens interferometer marker for use with a lens interferometer sensor in accordance with the present invention. To determine the polarisation state of the impinging radiation and/or the distribution of TM- and TE-polarized radiation, the present invention in one aspect provides a lens interferometer marker IW2 comprising a plurality of grating patches. A first set of the grating patches has a pitch in the X-direction; a second set of grating patches has a pitch in the Y-direction.

In both the first and the second set of grating patches, each grating patch GR1; GR2; GR3; GR4; GR5; GR6 comprises one or more sub-wavelength gratings SWG (in one or more open regions E2). The relatively opaque regions E1 are indicated by hatched areas within each grating patch.

Within each grating patch GR1; GR2; GR3; GR4; GR5; GR6 all sub-wavelength gratings SWG have an identical predetermined pitch. Preferably, the predetermined pitch of the sub-wavelength gratings SWG in one grating patch GR1; GR2; GR3; GR4; GR5; GR6 differs from the pitch of any of the sub-wavelength gratings SWG in any other of the plurality of grating patches GR1, GR2, GR3, GR4, GR5, GR6.

The grating patches GR1, GR2, GR3, GR4, GR5, GR6 may be arranged on the lens interferometer marker in any conceivable order. Each individual grating patch GR1; GR2; GR3; GR4; GR5; GR6 are preferably positioned relative to the other grating patches in such a way that the projected radiation beam can only have interaction with one individual grating.

Thus, in this embodiment a measurement can be done as follows. A grating patch GR with a particular pitch of the sub-wavelength gratings SWG is selected from the plurality of grating patches and is positioned above the detector S.

The selected grating patch has, for example, an area of about 200×200 µm$^2$.

By means of the lens interferometer aperture ML a portion of the radiation beam is selected. The selected portion of the radiation beam is, for example, bounded with an area of about 200×200 µm$^2$.

The selected portion of the radiation beam travels through the projection lens system PL and is projected on the selected grating patch GR with the particular pitch. After magnification by the projection lens system PL the projected portion of the radiation beam is, for example, bounded within an area of about 50×50 µm$^2$.

The projected portion of the radiation beam diffracts at the selected grating patch GR and the detector S measures the shearing interferogram as created by transmission of the projected radiation impinging on the selected grating patch GR.

The intensity of radiation transmitted by the sub-wavelength grating SWG varies relatively more strongly for TE-polarized radiation than for TM-polarized radiation as a function of the pitch of the sub-wavelength grating SWG. Thus, a variation of the ratio of TM-polarized and TE-polarized radiation in the radiation impinging on the detector may be observed as a function of the sub-wavelength grating pitch.

As described above, the shearing interferogram as measured by the detector S comprises information on the spatial coherence distribution for radiation wave fronts at the detection plane of the detector S. For a given grating patch with a given pitch of the sub-wavelength grating SWG, the transmitted intensity of a wavefront impinging on the grating patch as measured by the detector S is a combination of the transmitted intensity of the wavefront polarized in the X-direction and of the wavefront polarised in the Y-direction, since the sub-wavelength grating SWG will have a different transmission for radiation with a linear polarisation in the one direction for example, the X-direction, than for radiation with a linear polarisation in the other perpendicular direction (Y-direction). Typically, the measured transmitted intensity can be described by a weighted average of the transmitted intensity of the wavefront polarized in the X-direction and of the wavefront polarised in the Y-direction in accordance with equation 1.

$$Wt = Tx \cdot Wx + Ty \cdot Wy, \quad (1),$$

where Wx, Wy is the intensity of the radiation wave front impinging on the grating patch and polarised in the X- and Y-direction, respectively, Tx, Ty is the transmission factor of the grating patch for radiation wave fronts polarised in the X- and Y-direction, respectively, and Wt is the transmitted intensity of the radiation wave fronts as measured by the detector S. As known to persons skilled in the art, the transmission factors Tx, Ty of a grating can be determined in several ways, for example by a theoretical analysis of the grating parameters or by an external calibration.

The relevant grating parameters may comprise for example, pitch, ratio of the respective width of the lines and spaces of the grating, and the shape/contour of the lines and/or the spaces.

To determine either the radiation wave front Wx polarised in the X-direction or the radiation wave front Wy polarised in the Y-direction by the above equation, a measurement on two different grating patches, each with a different pitch and/or a different transmission factor Tx, Ty for radiation wave fronts polarised in the X- and Y-direction, respectively, will be required.

The resolution and accuracy of the determination of the radiation wave fronts polarised in X- and Y-direction can be improved by measurements on a larger number of grating patches with different respective pitch.

It is noted that the transmission factors Tx, Ty can be varied with each measurement by using grating patches that each have a different pitch in a given direction. Also, Tx, Ty can be varied by measuring on grating patches with a given identical pitch but different pitch direction.

Combining measurements on grating patches with a pitch in either the X- direction or the Y-direction may provide a more dynamical range for transmission factors Tx and Ty, which also may improve the resolution of measurements.

Accordingly, the measurement of the shearing interferograms can be repeated for each of the plurality of grating patches GR that has a different pitch of the sub-wavelength gratings SWG. Each measured shearing interferogram can be stored as a function of the sub-wavelength grating pitch. By analyzing the variation of the measured transmitted interferograms as a function of the sub-wavelength grating pitch and/or pitch direction, the ratio of the radiation wave fronts polarised in the X- and Y- direction, respectively, in the radiation impinging on the detector can determined.

In this way, both the TE- and TM-polarised components of the radiation impinging on the transmissive grating structure can be determined, both in terms of wavefront properties and intensity distribution.

By positioning the lens interferometer aperture ML at various positions and by positioning the detector S at associated positions in the projection plane, the intensity of the projected beam as a function of field point position in the pupil plane associated with the selected position of the lens interferometer aperture ML can be measured.

The wavefront and angular intensity distribution of the projected beam at each field point position can be measured as a function of both the pitch direction and the pitch size. Thus, the method allows determining the full pupil plane properties of the TE- and TM-components of the radiation beam for each field point.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers. Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
an illumination system configured to condition a radiation beam;
a projection system configured to project a portion of the radiation beam as a projected radiation beam;
a substrate table, constructed to hold a substrate to receive the projected radiation beam;
a lens interferometer for sensing a wavefront state of the projected radiation beam, wherein the lens interferometer is provided with a polarizing element so as to be capable of sensing a polarisation state of the projected radiation beam, wherein the lens interferometer comprises a lens interferometer marker arranged in a surface of the substrate table, and a detector, the lens interferometer marker comprising the polarizing element, the detector being arranged for receiving the portion of the received projected beam as transmitted by the polarizing element.

2. The lithographic apparatus according to claim 1, wherein the polarizing element is a sub-wavelength grating comprising an alternating sequence of sub-wavelength lines and spaces, the sub-wavelength grating having a pitch smaller than twice that of a wavelength of the projected radiation.

3. The lithographic apparatus according to claim 2, wherein the lens interferometer marker comprises at least one grating patch that comprises a plurality of surface elements of a first type and a plurality of surface elements of a second type, the surface elements of the first and second type mutually arranged in an alternating periodic sequence, the surface elements of the first type being relatively opaque to radiation, the surface elements of the second type being relatively transparent to radiation, and
the surface elements of the second type of the at least one grating patch each provided with the polarizing element.

4. The lithographic apparatus according to claim 3, wherein the pitch of the sub-wavelength grating extends in at least one of a first pitch direction and a second pitch direction; the second pitch direction being perpendicular to the first pitch direction.

5. The lithographic apparatus according to claim 3, wherein the lens interferometer marker comprises a plurality of grating patches, in each grating patch a pitch of a sub-wavelength grating being different from a pitch of sub-wavelength gratings in other grating patches.

6. The lithographic apparatus according to claim 5, wherein sub-wavelength gratings within the plurality of grating patches have a same pitch direction.

7. The lithographic apparatus according to claim 5, wherein each grating patch of a first set of the plurality of grating patches comprises sub-wavelength gratings having a first pitch direction and each grating patch of a second set of the plurality of grating patches comprises sub-wavelength gratings having a second pitch direction.

8. The lithographic apparatus according to claim 1, wherein the lens interferometer comprises a lens interferometer aperture for selecting the portion of the radiation beam as the projected radiation beam, a position of the lens interferometer aperture being associated with a field point position in a pupil plane of the projection system.

9. The lithographic apparatus according to claim 1, wherein the detector is arranged, relative to the projection system, behind the lens interferometer marker.

10. A lens interferometer for a lithographic apparatus, the lithographic apparatus comprising an illumination system configured to condition a radiation beam, a projection system configured to project a portion of the radiation beam as a projected radiation beam, and a substrate table, constructed to hold a substrate to receive the projected radiation beam; the lens interferometer being arranged for sensing a wavefront state of a radiation beam, wherein the lens interferometer is provided with a polarizing element so as to be capable of sensing a polarization state of the radiation beam at the substrate table, wherein the lens interferometer comprises a lens interferometer marker and a detector, the lens interferometer marker comprising the polarizing element, the detector being arranged for receiving the at least portion of the received projected beam as transmitted by the polarizing element.

11. The lens interferometer according to claim 10, wherein the polarizing element is a sub-wavelength grating comprising an alternating sequence of sub-wavelength lines and spaces, the sub-wavelength grating having a pitch smaller than twice that of a wavelength of the projected radiation.

12. The lens interferometer according to claim 11, wherein the lens interferometer marker comprises at least one grating patch that comprises a plurality of surface elements of a first type and a plurality of surface elements of a second type, the surface elements of the first and second type mutually arranged in an alternating periodic sequence, the surface elements of the first type being relatively opaque to radiation, the surface elements of the second type being relatively transparent to radiation, and the surface elements of the second type of the at least one grating patch provided with the polarizing element.

13. The lens interferometer according to claim 11, wherein the pitch of the sub-wavelength grating extends in at least one of a first pitch direction and a second pitch direction; the second pitch direction being perpendicular to the first pitch direction.

14. The lens interferometer according to claim 12, wherein the lens interferometer marker comprises a plurality of grating patches, in each grating patch a pitch of a sub-wavelength grating being different from a pitch of a sub-wavelength grating in other grating patches.

15. The lens interferometer according to claim 14, wherein sub-wavelength gratings within the plurality of grating patches have a same pitch direction.

16. The lens interferometer according to claim 14, wherein each grating patch of a first set of the plurality of grating patches comprises sub-wavelength gratings having a first pitch direction and each grating patch of a second set of the plurality of grating patches comprises sub-wavelength gratings having a second pitch direction.

17. The lens interferometer according to claim 10, wherein the lens interferometer comprises a lens interferometer aperture for selecting the portion of the radiation beam as the projected radiation beam, a position of the lens interferometer aperture being associated with a field point position in a pupil plane of the projection system.

18. A device manufacturing method, comprising:
selecting an illumination mode for imaging a pattern onto a substrate held on a substrate table;
projecting at least a portion of a radiation beam as a projected radiation beam in accordance with the selected illumination mode;
providing a lens interferometer for sensing a wavefront state of the projected radiation beam;
providing the lens interferometer with a polarizing element so as to be capable of sensing a polarisation state of the projected radiation beam;
adjusting a polarization distribution of the selected illumination mode on the basis of the sensed polarization state; and
imaging the pattern onto a radiation sensitive substrate using the adjusted polarization distribution and the selected illumination mode.

19. The device manufacturing method according to claim 18, wherein the sensing of the polarisation state of the projected radiation beam comprises:
receiving the projected beam on a polarizing element of a lens interferometer marker;
transmitting at least a portion of the received projected beam as a transmitted projected beam through the polarizing element of the lens interferometer marker; and
receiving the transmitted projected beam on a detector for measuring an intensity of the transmitted projected beam.

20. The device manufacturing method according to claim 19, wherein the polarizing element is a sub-wavelength grating comprising an alternating sequence of sub-wavelength lines and spaces, the sub-wavelength grating having a pitch smaller than twice the wavelength of the projected radiation.

21. The device manufacturing method according to claim 20, comprising:
providing the lens interferometer marker with at least one grating patch that comprises a plurality of surface elements of a first type and a plurality of surface elements of a second type, the plurality of elements of the first and second type arranged in an alternating periodic sequence, the surface elements of the first type being relatively opaque to radiation, the surface elements of the second type being relatively transparent to radiation; and
providing the surface elements of the second type of the at least one grating patch with the polarizing element.

22. The device manufacturing method according to claim 19, comprising:
providing the lens interferometer marker with a plurality of grating patches, in each grating patch a pitch of a sub-wavelength grating being different from a pitch of a sub-wavelength grating in other grating patches.

23. The device manufacturing method according to claim 22, comprising:
providing a sub-wavelength grating in each of the plurality of grating patches with a same pitch direction.

24. The device manufacturing method according to claim 22, comprising:
providing each grating patch of a first set of the plurality of grating patches with sub-wavelength gratings having a first pitch direction; and
providing each grating patch of a second set of the plurality of grating patches with sub-wavelength gratings having a second pitch direction, the second pitch direction being perpendicular to the first pitch direction.

25. The device manufacturing method according to claim 22, comprising:
selecting one grating patch from the plurality of grating patches with a first pitch for the receiving of the projected beam on the polarizing element of the lens interferometer marker;
measuring an intensity of the transmitted projected beam by the detector;
storing the measured intensity as a first measured intensity associated with the first grating patch having the first pitch.

26. The device manufacturing method according to claim 25, comprising:
repeating the selection of one grating patch for a second grating patch having a second pitch;
measuring an intensity of the transmitted projected beam by the detector; and
storing the measured intensity as a second measured intensity associated with the second grating patch having the second pitch.

27. The device manufacturing method according to claim 26, comprising:
analyzing a variation of the first and second measured intensities in relation to the first and second pitch, the first pitch having transmission factors for the transmission of radiation polarized in the first and second pitch directions different from the respective transmission factors for the second pitch.

28. The device manufacturing method according to claim 27, wherein the analyzing the variation of the first and at least one second measured intensities is carried out as a function of a pitch direction of the sub-wavelength gratings.

29. The device manufacturing method according to claim 27, wherein the analyzing of the variation of the first and second measured intensities is carried out as a function of a field point position in a pupil plane associated with the projecting the portion of the radiation beam, the method comprising:
selecting a portion of the radiation beam by a lens interferometer aperture, a position of the lens interferometer aperture being associated with the field point position.

30. The device manufacturing method according to claim 26, wherein the method further comprises:
determining a ratio of TE- and TM-polarised radiation for each field point in a pupil plane, whereby pupil plane properties of the TE- and TM-components of the radiation beam for each field point are obtained.

* * * * *